United States Patent [19]

Wu

[11] Patent Number: 5,878,073
[45] Date of Patent: Mar. 2, 1999

[54] FOCAL DISTANCE ADJUSTABLE LASER MODULE

[75] Inventor: Jen-Chih Wu, Keelung, Taiwan

[73] Assignee: Quarton Inc., Taipei, Taiwan

[21] Appl. No.: 759,511

[22] Filed: Dec. 4, 1996

[51] Int. Cl.$^6$ ......................................................... H01S 3/08
[52] U.S. Cl. ............................................. 372/108; 359/829
[58] Field of Search ............................ 372/108; 359/823, 359/829

[56] References Cited

U.S. PATENT DOCUMENTS 5,381,438   1/1995   Guo et al. ................................. 372/108

Primary Examiner—Rodney B. Bovernick
Assistant Examiner—Robert E. Wise
Attorney, Agent, or Firm—Rosenberg, Klein & Bilker

[57] ABSTRACT

A focal distance adjustable laser module including a cap having a tapered laser firing hole, a lens holder press-fitted into the cap to hold a rubber packing ring and a lens on the rubber packing ring and having an inner thread at the back side, a laser diode holder holding a mounting plate and a laser diode on the mounting plate and having an outer thread at the front side threaded into the inner thread of the lens holder, a circuit board secured to the mounting plate at the back and connected to the laser diode to control its operation, and a spring mounted inside the lens holder and imparting a backward pressure to the laser diode holder to prohibit displacement of the laser diode holder relative to the lens holder.

4 Claims, 5 Drawing Sheets

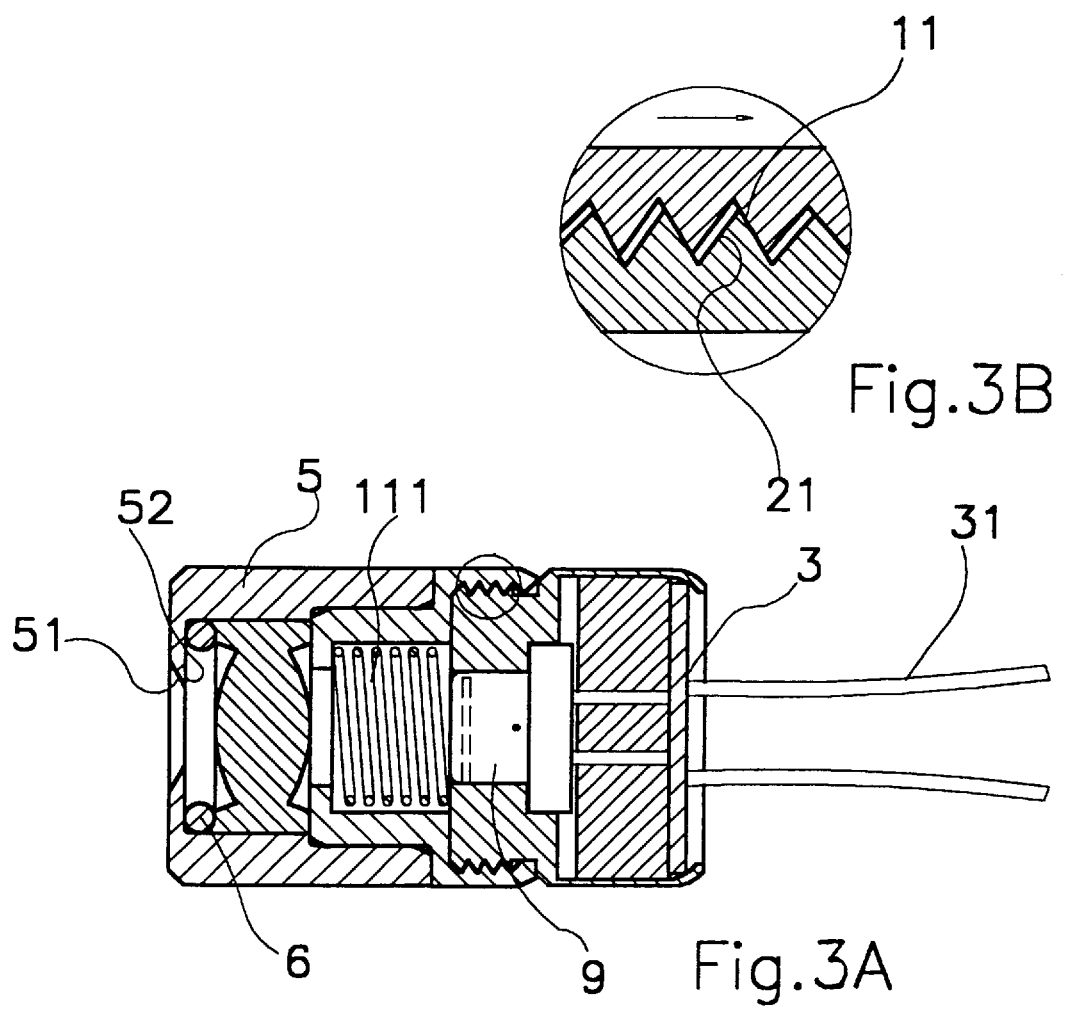

FOCAL DISTANCE ADJUSTABLE LASER MODULE

BACKGROUND OF THE INVENTION

The present invention relates to focal distance adjustable laser modules, and relates more particularly to such a focal distance adjustable laser module which is inexpensive to manufacture and easy to assemble.

Various laser modules are well known, and intensively used in laser pointers, laser range finders, etc. However, regular laser modules are still not satisfactory in function. For example, in U.S. Pat. No. 5,394,430, the focal distance of the laser module is not adjustable. The focal distance of the laser module of U.S. Pat. No. 5,121,188 can be adjusted through a screw joint. However, because the two threaded members tend to displace relative to each other, the focal distance may change after an adjustment is done. In order to eliminate this problem, the screw joint must be fixed by sealing means when the focal distance is adjusted to the desired range. However, when the screw joint is fixed by sealing means, the focal distance can no loner be adjusted. FIGS. 1A and 1B show another structure of laser module according to the prior art. This structure of laser module comprises a screw cap 101, a lens 102, a cylindrical casing 103, and a mounting plate 104. The screw cap 101 holds the lens 102 on the inside, having an outer thread 114 at the rear end threaded into an inner thread 131 at the front end of the cylindrical casing 103. The mounting plate 104 holds a semiconductor chip 141 and a photodetector 142. A cover 145 which holds a glass 146 is covered on the mounting plate 104 over the semiconductor chip 141 and the photodetector 142, and then mounted with the mounting plate 104 inside the cylindrical casing 103. Because the lens 102 is finished through a grinding process by labor, its focal length is difficult to be accurately obtained. Therefore, when the laser module is assembled, the focal distance must be calibrated. However, when the inner thread 131 and the outer thread 114 are meshed together, there is gaps left in the threads, therefore the cylindrical casing 103 and the screw cap 101 tend to displace relative to each other, causing the adjusted focal distance to be changed. In order to eliminate this problem, the connecting area between the screw cap 101 and the cylindrical casing 103 must be sealed with a sealing agent when the focal distance is adjusted. However, when the connecting area between the screw cap 101 and the cylindrical casing 103 is sealed by a sealing agent, the focal distance is fixed, and can no longer be adjusted again.

SUMMARY OF THE INVENTION

The present invention has been accomplished to provide a laser module which eliminates the aforesaid drawbacks. According to one aspect of the present invention, the focal distance adjustable laser module comprises a lens holder which holds a lens and has an inner thread at the back side, a laser module holder which holds a laser diode and has an outer thread threaded into the inner thread of the lens holder, and a spring mounted inside the lens holder to impart a backward pressure to the laser diode holder. The screw joint between the lens holder and the laser diode holder permits the focal distance between the laser diode and the lens to be conveniently adjusted. The spring force of the spring holds down the engagement between the inner thread of the lens holder and the outer thread of the laser diode holder, therefore the focal distance does not change when adjusted. According to another aspect of the present invention, a circuit board is press-fitted into the back side of the laser diode holder, and connected to the laser diode to control its operation. According to another aspect of the present invention, a cap is covered on the lens holder over the lens to hold a rubber packing ring on the inside for supporting the lens in position.

BRIEF DESCRIPTION OF THE DRAWINGS

FIG. 3A is a sectional assembly view of the focal distance adjustable laser module shown in FIG. 2, FIG. 3B is an enlarged view of a part of FIG. 3A, showing the inner thread of the lens holder and the outer thread of the laser diode holder meshed together in one direction;

DETAILED DESCRIPTION OF THE PREFERRED EMBODIMENT

Figure 1:
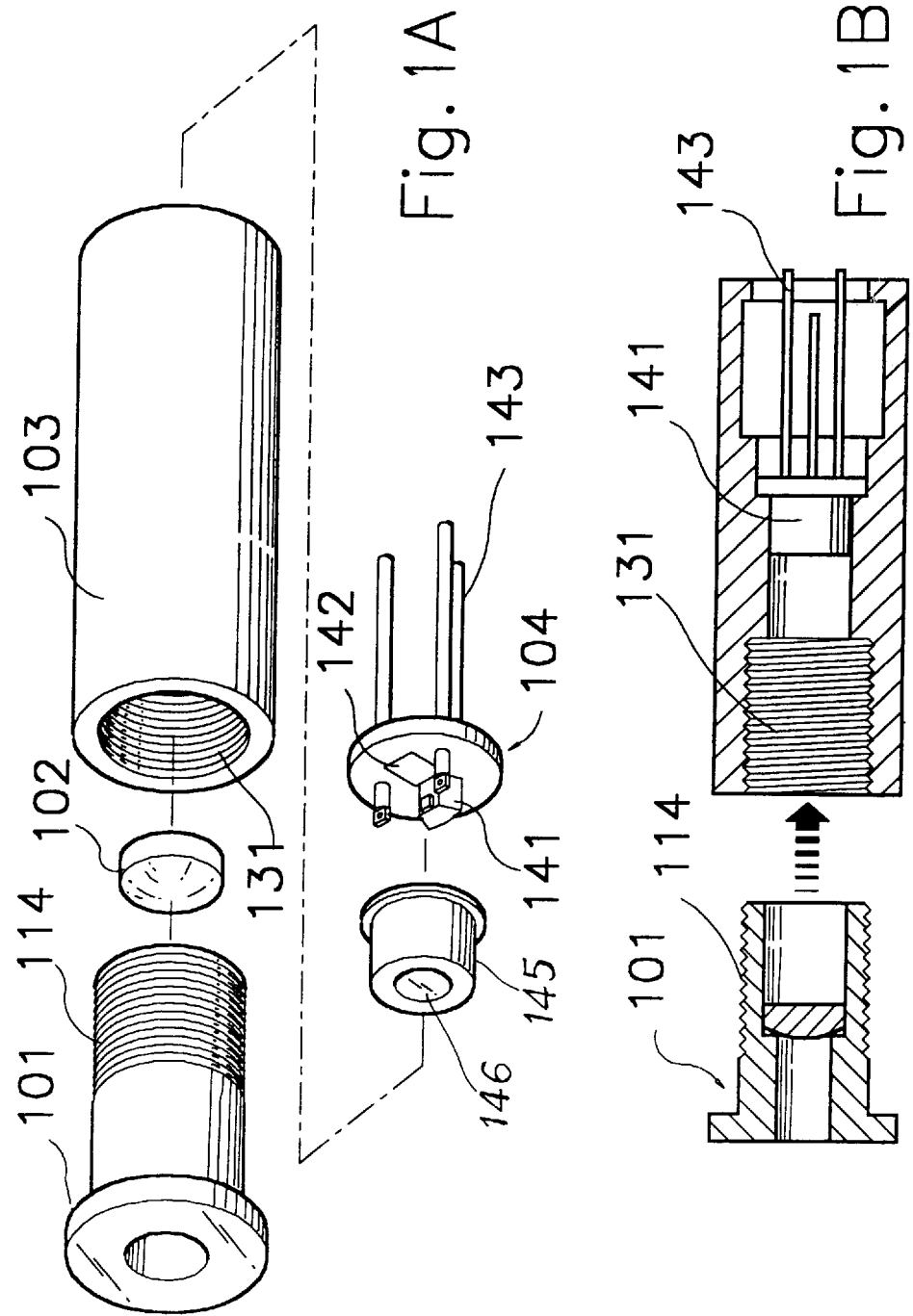
FIG. 1A is an exploded view of a laser module according to the prior art.
FIG. 1B is a sectional assembly view of the laser module shown in Figure 1A.
Figure 2:
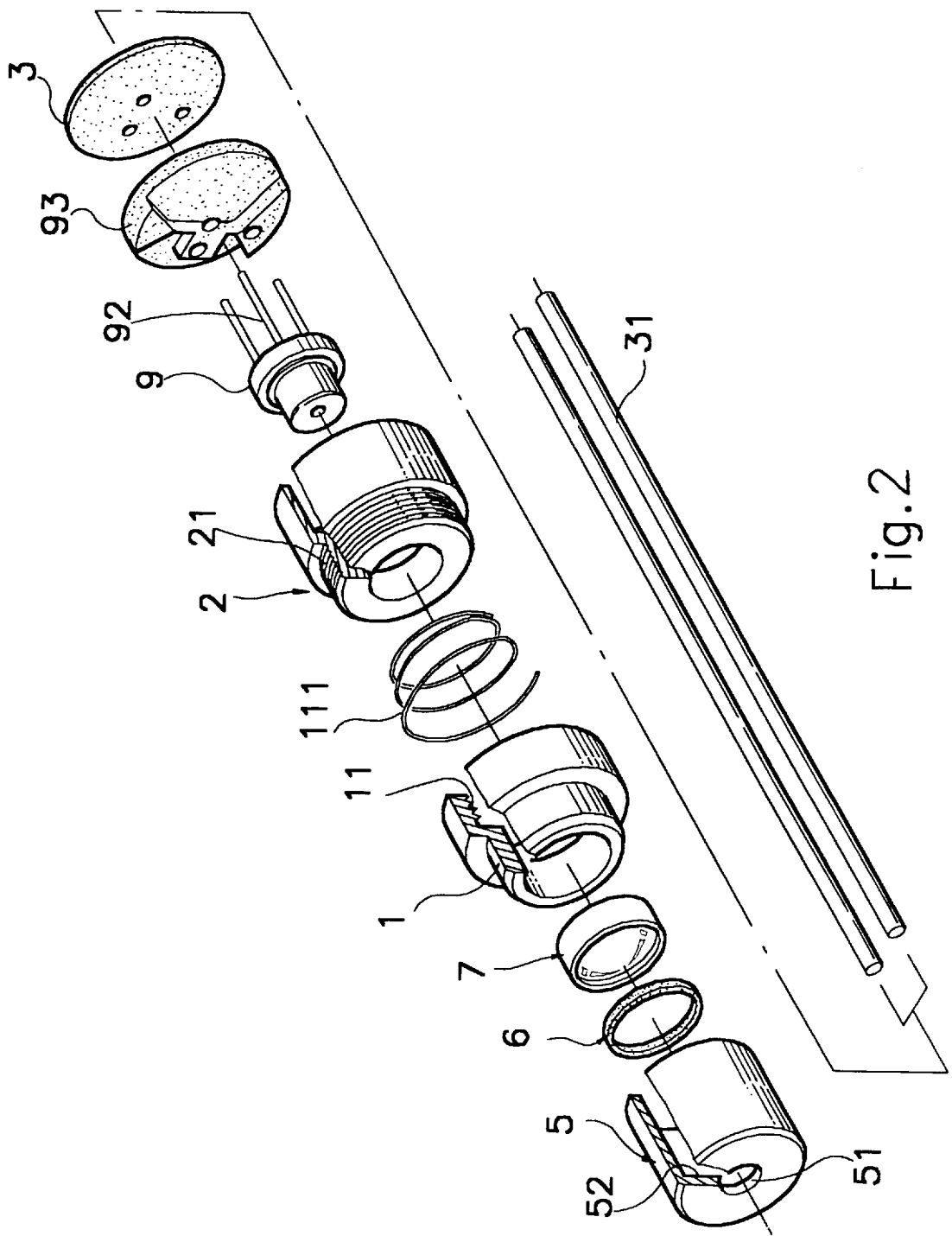
FIG. 2 is an exploded view of a focal distance adjustable laser module according to the present invention.

Referring to FIGS. 2, 3A, and 3B, an adjustable laser module in accordance with the present invention is generally comprised of a cap 5, a packing ring 6, a lens 7, a lens holder 1, a spring 111, a laser diode holder 2, a laser diode 9, a mounting plate 93, and a circuit board 3. The cap 5 has a cylindrical profile, a front wall 52, and a tapered axial center through hole, namely, the laser firing hole 51 through the center of the front wall 52. The diameter of the tapered axial center through hole 51 increases gradually toward the outside. The packing ring 6 is mounted in the cap 5 and closely attached to the inner side of the front wall 52. The lens 7 is mounted in the cap 5 and supported on the packing ring 6. The lens holder I is press-fitted into the cap 5 to hold down the lens 7, having an inner thread II at the rear end. The laser diode holder 2 has an outer thread 21 at the front end threaded into the inner thread 11 of the lens holder 1. The spring 111 is mounted in between the lens holder I and the laser diode holder 2. When the outer thread 21 of the laser diode holder 2 is threaded into the inner thread 11 of the lens holder 1, the spring 111 imparts a backward pressure to the laser diode holder 2, thereby causing the inner thread 11 of the lens holder 1 and the outer thread 21 of the laser diode holder 2 to be firmly meshed together (see FIG. 3B). Because the inner thread 11 and the outer thread 21 are meshed in one direction, the laser diode holder 2 does not displace relative to the lens holder 1, and the focal length is maintained firmly when adjusted. The laser diode 9 is carried on the mounting plate 93 and mounted within the laser diode holder 2, having a plurality of legs 92 inserted through a respective through hole in the mounting plate 93 and connected to the circuit board 3. The circuit board 3 has a flat, rounded shape closely attached to the back side of the mounting plate 93, having two conductors 31 adapted for connecting to a power control circuit. When the laser diode holder 2 is turned relative to the lens holder 1, the focal distance between the lens 7 and the laser diode 9 is adjusted. When adjusted, the connection between the lens holder 1 and the laser diode holder 2 is held down by the spring force of the spring 111, and therefore the focal distance between the lens 7 and the laser diode 9 is maintained firmly.

Figures 4A, 4B:
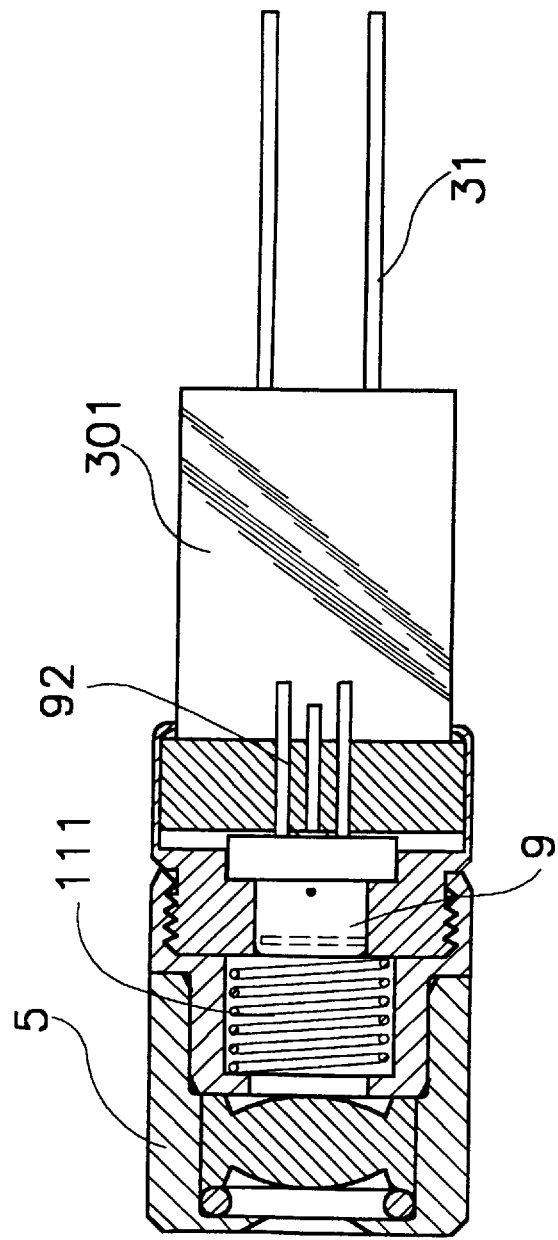
FIG. 4A is a sectional assembly view of an alternate form of the present invention.
FIG. 4B is a rear end view of the alternate form of FIG. 4A.

FIGS. 4A and 4B show an alternate form of the present invention, in which the circuit board 301 has a substantially rectangular profile disposed in the axial direction.

Figure 5:
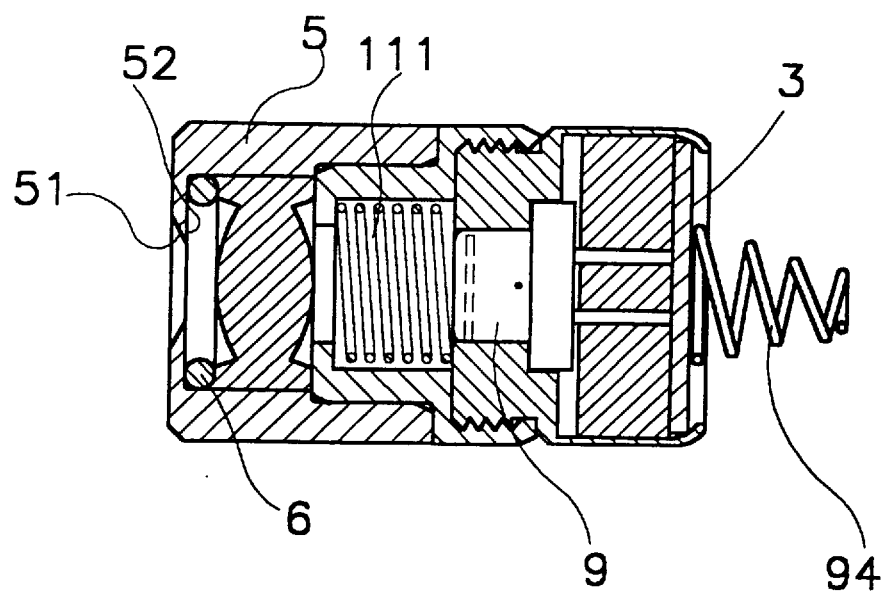
FIG. 5 is a sectional assembly view of another alternate form of the present invention, showing a spiral metal contact spring installed in the circuit board at the back side.

FIG. 5 shows still another alternate form of the present invention, in which a spiral metal contact spring 94 is installed in the back side of the circuit board 3.

It is to be understood that the drawings are designed for purposes of illustration only, and are not intended as a definition of the limits and scope of the invention disclosed.

What the invention claimed is:

1. A focal distance adjustable laser module comprising:

a cap having a cylindrical profile, and a tapered laser firing hole at an axial center, said tapered laser firing hole having a diameter gradually increasing toward the outside;

a lens supported on a rubber packing ring inside said cap;

a lens holder having a front end press-fitted into said cap to hold down said lens, and an inner thread at a rear end thereof;

a laser diode holder holding a mounting plate and a laser diode on said mounting plate, said laser diode holder comprising an outer thread at a front end thereof threaded into said inner thread of said lens holder, and being turned relative to said lens holder to adjust the focal distance between said lens and said laser diode;

a spring mounted inside said lens holder and imparting a backward pressure to said laser diode holder; and a circuit board mounted on said mounting plate at a back side thereof and connected to said laser diode for controlling its operation.

2. The focal distance adjustable laser module of claim 1 wherein said circuit board has a flat rounded shape.

3. The focal distance adjustable laser module of claim 1 wherein said circuit board has a flat rectangular shape.

4. The focal distance adjustable laser module of claim 1 wherein said circuit board is mounted with a spiral metal contact spring.

* * * * *